(12) United States Patent
Ito et al.

(10) Patent No.: US 6,450,033 B1
(45) Date of Patent: Sep. 17, 2002

(54) SEMICONDUCTOR PHYSICAL QUANTITY SENSOR

(75) Inventors: Takeshi Ito, Okazaki (JP); Muneo Yorinaga, Anjo (JP); Hirofumi Higuchi, Okazaki (JP)

(73) Assignees: Denso Corporation, Kariya (JP); Nippon Soken, Inc., Nishio (JP)

( * ) Notice: Subject to any disclaimer, the term of this patent is extended or adjusted under 35 U.S.C. 154(b) by 65 days.

(21) Appl. No.: 09/621,133

(22) Filed: Jul. 20, 2000

(30) Foreign Application Priority Data

Jul. 22, 1999 (JP) .......................... 11-207715

(51) Int. Cl.[7] .............................. G01P 15/10
(52) U.S. Cl. .................. 73/514.29; 73/514.38
(58) Field of Search ....................... 73/514.15, 514.16, 73/514.24, 514.29, 514.32, 514.22, 514.23, 504.02, 504.04, 504.12, 504.14, 514.38

(56) References Cited

U.S. PATENT DOCUMENTS

| 4,939,935 A | | 7/1990 | Amand ................... 73/DIG. 1 |
| 5,542,295 A | | 8/1996 | Howe et al. ............. 73/514.18 |
| 5,646,347 A | | 7/1997 | Weiblen et al. .......... 73/514.32 |
| 5,734,105 A | | 3/1998 | Mizukoshi ................ 73/504.02 |
| 5,760,455 A | * | 6/1998 | Hierold et al. ........... 73/514.32 |
| 5,808,198 A | * | 9/1998 | Ward et al. .............. 73/514.32 |
| 5,948,982 A | | 9/1999 | Woodruff et al. ........ 73/514.29 |
| 5,969,225 A | * | 10/1999 | Kobayashi ............... 73/504.12 |
| 6,173,612 B1 | * | 1/2001 | Golecki et al. .......... 73/514.32 |

OTHER PUBLICATIONS

M. Lutz et al., "A Precision Yaw Rate Sensor in Silicon Micromachining." IEEE Transducers '97, Jun. 16, 1997, p. 10.
Photograph, Bosch yaw rate sensor chip SGG020 (date not available).

* cited by examiner

*Primary Examiner*—Helen Kwok
(74) *Attorney, Agent, or Firm*—Law Offices of David G. Posz

(57) ABSTRACT

A semiconductor angular velocity sensor has a frame-shaped base portion, a detection oscillator connected to the base portion through a detection beam portion, and a drive oscillator connected to the detection oscillator through a drive beam portion. Each of the beam portions has a pair of beams each generally having a U shape and connected to each other through a bridge portion. Accordingly, the beam portions can have large rotational rigidity not to prevent oscillations of the oscillators.

22 Claims, 7 Drawing Sheets

E

F

SEMICONDUCTOR PHYSICAL QUANTITY SENSOR

CROSS REFERENCE TO RELATED APPLICATION

This application is based upon and claims the benefit of Japanese Patent Application No. 11-207715 filed on Jul. 22, 1999, the contents of which are incorporated herein by reference.

BACKGROUND OF THE INVENTION

1. Field of the Invention

This invention relates to a semiconductor physical quantity sensor having a semiconductor oscillator such as an acceleration sensor or an angular velocity sensor, which is adopted to detect a moving state of a moving body such as a vehicle, an airplane, or a robot.

2. Description of the Related Art

Generally, this kind of semiconductor physical quantity sensor is formed by a micro-machine processing technique such as etching performed on a semiconductor substrate. The semiconductor physical quantity sensor typically has a base, an oscillator that oscillates in a specific direction, and several beam portions connecting the oscillator and the base. A physical quantity (angular velocity, acceleration, or the like) is detected based on oscillation of the oscillator.

For instance, when the semiconductor quantity sensor is an angular velocity sensor, the oscillator is drive-oscillated in a specific direction. An angular velocity applied to the sensor is detected based on oscillation (detection oscillation) that is produced by a Coriolis force in a direction perpendicular to the drive oscillation direction and a rotational axis of the angular velocity.

When the semiconductor quantity sensor is an acceleration sensor, acceleration applied to the oscillator is detected based on oscillation (detection oscillation) that is produced in a specific direction.

SUMMARY OF THE INVENTION

However, it is inevitable for the conventional physical quantity sensor to have processing errors (for instance, by etching). The processing errors can induce unnecessary oscillation in addition to the drive oscillation and detection oscillation described above, resulting in measurement errors. The inventors considered that the unnecessary oscillation might be produced due to the beam portions connecting the oscillator and the base. That is, in the conventional physical quantity sensor as disclosed in JP-A-6-123631, each of the beam portions is composed of one pole-like beam having small rotational rigidity. Therefore, each beam can be distorted easily during the oscillation of the oscillator to induce unnecessary oscillation.

The present invention has been made in view of the above problems. An object of the present invention is to provide a semiconductor physical quantity sensor having a beam portion that is structured with high rotational rigidity not to prevent oscillation of an oscillator.

According to the present invention, a beam portion is composed of first and second beams that are disposed in parallel with and separately from each other, and abridge portion connecting the first and second beams. This beam portion can have increased rotational rigidity without preventing oscillation of an oscillator.

Preferably, each of the first and second beams has a first part extending in a direction approximately perpendicular to an oscillation direction in which the oscillator oscillates to detect a physical quantity, and a second part extending in the oscillation direction and connected to the bridge portion. More preferably, a width defined between the second part of the first beam and the second part of the second beam is larger than that defined between the first part of the first beam and the first part of the second beam. Accordingly, a difference in displacement between the first and second beams caused by a difference in length between the first parts of the first and second beams can be absorbed easily not to prevent the oscillation of the oscillator.

Preferably, the first and second beams defines a gap therebetween, and the bridge portion divides the gap into first and second gaps each having a generally L shape so that the first and second gaps are symmetrical with each other with respect to the bridge portion. More preferably, the bridge portion has a width that is approximately equal to that of the first and second beams. This feature further facilitates the oscillation of the oscillator.

BRIEF DESCRIPTION OF THE DRAWINGS

Other objects and features of the present invention will become more readily apparent from a better understanding of the preferred embodiment described below with reference to the following drawings, in which.

DETAILED DESCRIPTION OF THE PREFERRED EMBODIMENT

Figure 1:
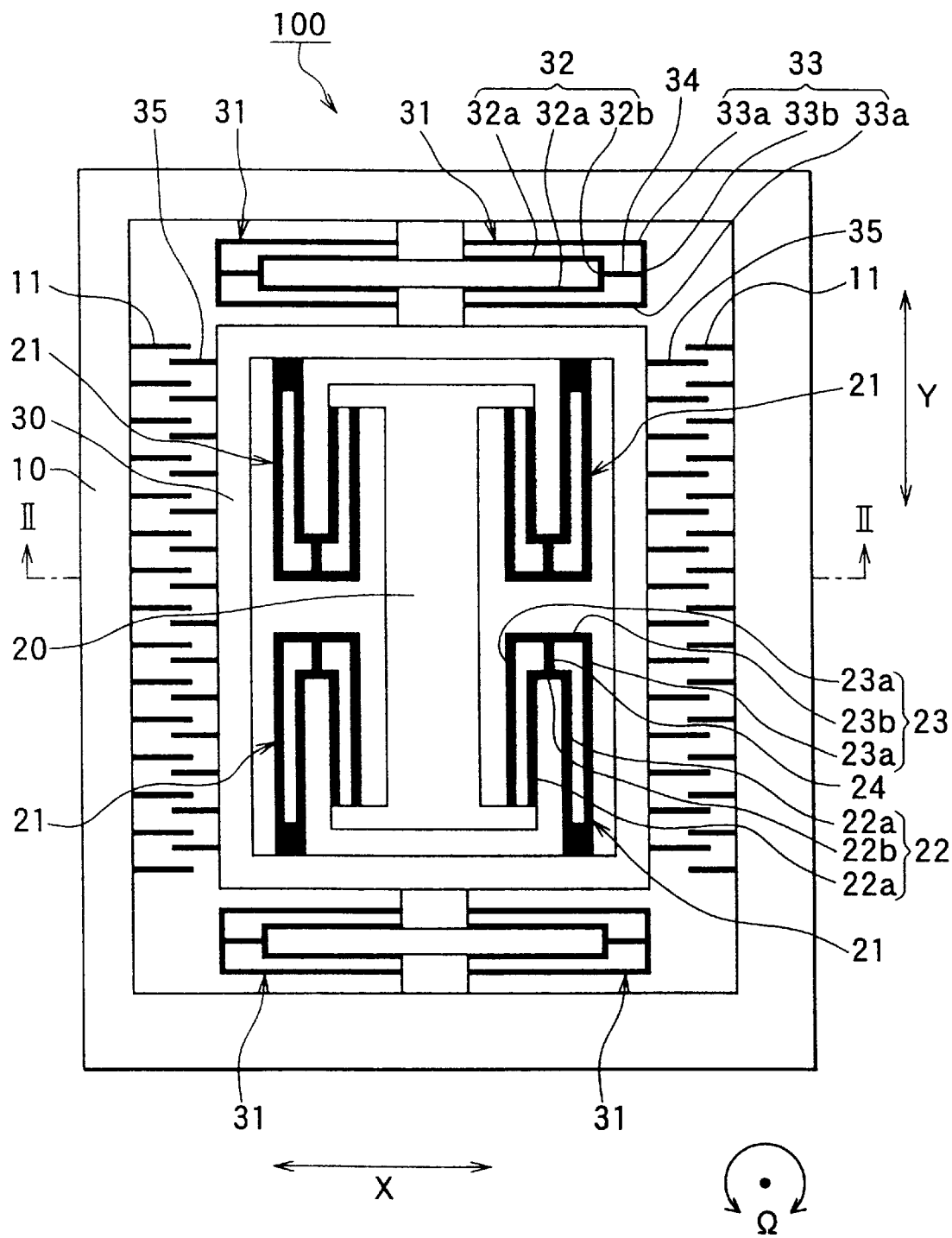
FIG. 1 is a plan view showing an angular velocity sensor according to a preferred embodiment of the present invention.
Figure 2:
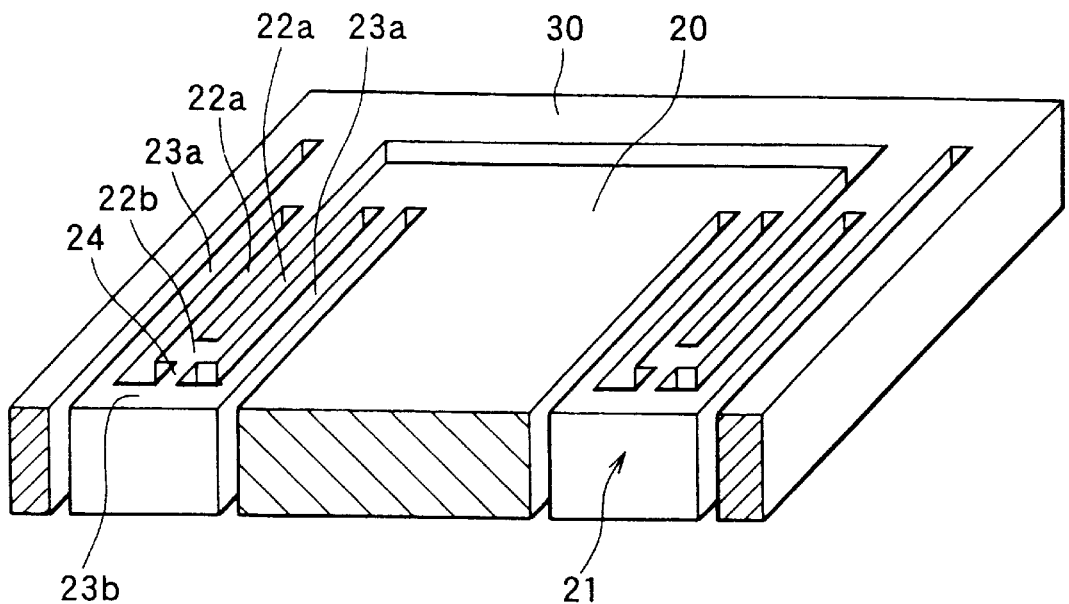
FIG. 2 is a partially cross-sectional perspective view including a cross section taken along line II—II in FIG. 1.

Referring to FIGS. 1 and 2, an angular velocity sensor 100 in a preferred embodiment has a rectangular frame-like base portion and a movable portion movably disposed in the frame-like base portion 10. The base portion 10 and the movable portion are divided by grooves formed on a semiconductor substrate made of, for instance, silicon, by etching.

The movable portion is composed of a generally rectangular drive oscillator 20, a rectangular frame-like detection oscillator 30, several (four in the figure) drive beam portions 21, and several (four in the figure) detection beam portions 31. The drive beam portions 21 connect the drive oscillator 20 and the detection oscillator 30, and the detection beam portions 31 connect the detection oscillator 30 and the base portion 10. That is, the drive oscillator 20 is integrated with the detection oscillator 30 through the drive beam portions 21. The drive oscillator 20 is connected to the base portion 10 through the drive beam portions 21, the detection oscillator 30, and the detection beam portions 31.

Figure 3:
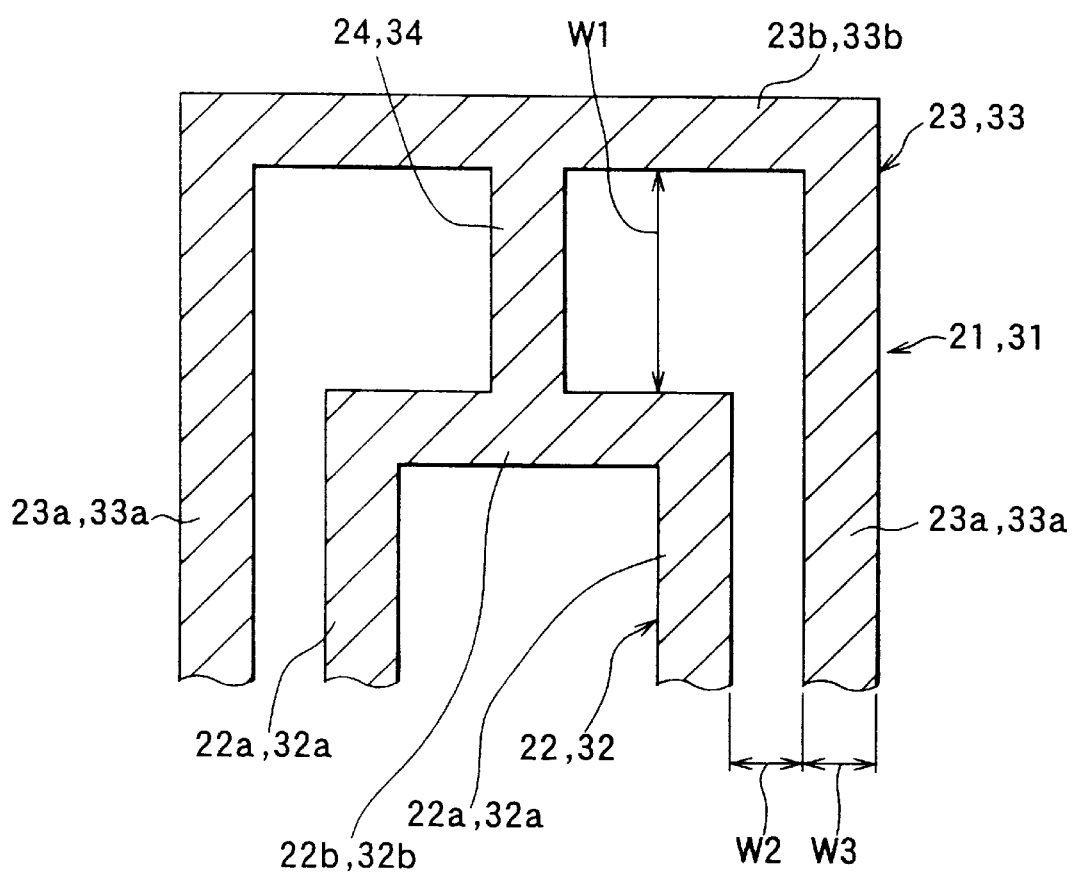
FIG. 3 is an explanatory view showing a beam portion for explaining dimensions of the beam portion.

Referring to FIG. 3, each of the drive beam portions 21 is composed of a pair of beams 22, 23 having a similar U shape. The generally U-shaped second beam 23 is disposed at an outer circumference side of the generally U-shaped first beam 22. The beams 22, 23 are parallel to and separate from each other. The pair of beams 22, 23 has one end side connected to the drive oscillator 20 and the other end side connected to an frame inner circumference surface of the detection oscillator 30.

Each of the first and second beams 22 and 23 has a pair of parallel pole portions 22a or 23a deformable in a direction perpendicular to a longitudinal direction thereof. Accordingly, the drive oscillator 20 can oscillate in direction X indicated by an arrow in FIG. 1. Connecting pole portions 22a, 23b respectively connect pairs of the parallel pole portions 22a, 23a at the ends of the pole portions 22a, 23a, and a beam-shaped bridge portion (connecting pole) 24 connects the connecting pole portions 22b, 23b.

On the other hand, each of the detection beam portions 31 is composed of a pair of beams 32, 33 having a similar U-shape. The generally U-shaped second beam 33 is provided at an outer circumference side of the generally U-shaped first beam 32. The beams 32, 33 are provided in parallel with each other while defining a gap therebetween. The pair of beams 32, 33 is connected to the detection oscillator 30 at one end side thereof, and is connected to a protruding portion of the base portion 10 at the other end side thereof. The protruding portion protrudes from a frame inner circumference surface of the base portion 10. In the first and second beams 32, 33 of each detection beam portion 31, pairs of parallel pole portions 32a, 33a are deformed in a direction perpendicular to the longitudinal direction thereof. Accordingly, the detection oscillator 30 can oscillate approximately parallel to the substrate surface in a direction (direction Y indicated by an arrow in FIG. 1) generally perpendicular to the oscillation direction of the drive oscillator 20. Connecting pole portions 32b, 33b respectively connect the pairs of parallel pole portions 32a, 33a at the ends of the pole portions 32a, 33a, and a beam-shaped bridge portion (connecting pole) 34 connects the connecting pole portions 32b, 33b.

In every beam portion 21, 31, in a gap defined between the first beam 22, 32 and the second beam 23, 33, a distance (first gap) W1 between the connecting pole portions 22b, 32b and 23b, 33b is larger than a distance (second gap) W2 between the parallel pole portions 22a, 32a and 23a, 33a. The bridge portion 24, 34 preferably has a width W3 approximately the same as that of the pair of beams. For instance, the distance W1 is 50 $\mu$m, and the distance W2 is 10 $\mu$m. Further, each width W3 of the beams 22, 23, 32, 33, and the bridge portions 24, 34 is 10 $\mu$m.

Referring back to FIG. 1, the detection oscillator 30 has comb-shaped protrusions 35 protruding from the outer circumference portion thereof toward the inner circumference portion of the base portion 10 facing to the detection oscillator 30. The base portion 10 has comb-shaped protrusions 11 protruding from the inner circumference portion thereof to be engaged with the protrusions 35. The protrusions 35 and 11 cooperatively constitute an electrode portion for detection in the sensor 100.

An operation of the angular velocity sensor 100 having the above structure is explained below. First, the drive oscillator 29 is oscillated (drive-oscillated) in the direction X shown in FIG. 1 by electromagnetic drive, capacitance drive, or the like a constitution of which is not shown. When an angular velocity $\Omega$ is applied to the sensor 100 around an axis perpendicular to the paper space of FIG. 1 under the drive oscillation, a Coriolis force is produced in the drive oscillator 20 in the direction Y that is perpendicular to the drive oscillation direction.

The Coriolis force is transmitted from the drive oscillator to the detection oscillator 30, and accordingly, the drive oscillator 20 and the detection oscillator 30 oscillate (detection-oscillate) together in the direction Y in FIG. 1. This detection oscillation changes each distance between the protrusions 11 and 35 facing each other. The change in distance is detected as a change in capacitance between the protrusions 11 and 35 through a wiring members and the like not shown formed on the base portion 10. The angular velocity $\Omega$ can be detected based on the change in capacitance.

According to the present embodiment, each of the beam portions 21, 32 is composed of a pair of beams disposed in parallel with each other while being separated from each other, i.e., while defining a gap therebetween. Because of this, each beam portion can have high rotational rigidity without preventing oscillation of the oscillator. Incidentally, only thickening the beam portions can increase the rotational rigidity but is difficult to provide the displacement required for the sensor, and might disturb oscillation of the oscillators 20, 30.

The U-shaped first and second beams 22, 23, 32, 33 are connected not at the parallel pole portions 22a, 23a, 32a, 33a that are deformed in the oscillation direction of each oscillator 20, 30, but at the connecting pole portions 22b, 23b, 32b, 33b that hardly contribute the oscillation. Therefore, each beam portion 21, 31 does not prevent the oscillation of the oscillators 20, 30.

Figure 4:
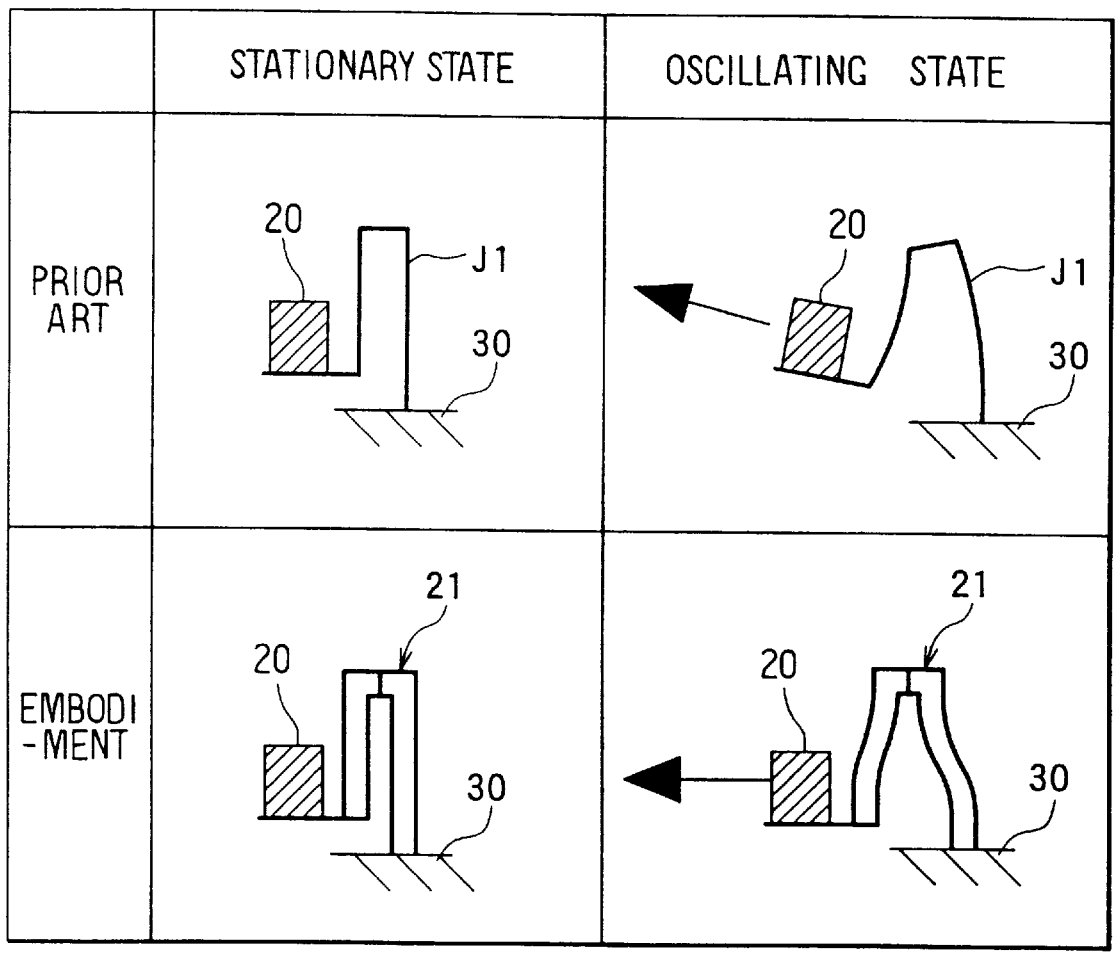
FIG. 4 is an explanatory view for explaining a function of the angular velocity sensor shown in FIG. 1 compared to a prior art.
Figures 5A, 5B, 5C, 5D:
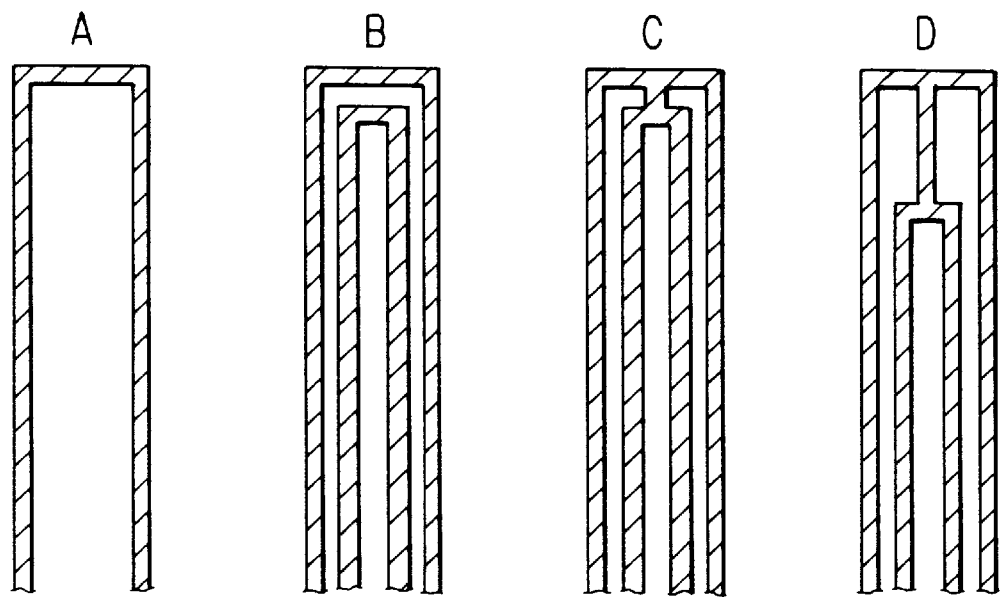
FIGS. 5A to 5D are schematic views showing samples A to D of beam portions used for evaluating unnecessary oscillations.

The features of the beam portions in the present embodiment are explained referring to FIG. 4 in more detail. A target oscillation direction of the oscillator 20 is a lateral direction in FIG. 4. In a conventional sensor, a beam portion J1 connecting the drive oscillator 20 and the detection oscillator 30 is composed of one U-shaped member, rotational rigidity of which is small. Therefore, the drive oscillator 20 oscillates in a slightly upward inclined direction as compared to the target oscillation direction.

On the other hand, according to the beam structure of the present embodiment having increased rotational rigidity, the drive oscillator 20 can oscillate in the target oscillation direction. As a result, according to the present embodiment, unnecessary vibration is reduced, and offset is hardly produced. That is, output is hardly generated when the angular velocity is zero. The angular velocity sensor adopting the beam structure described above can be provided with high detection accuracy.

Figure 6:
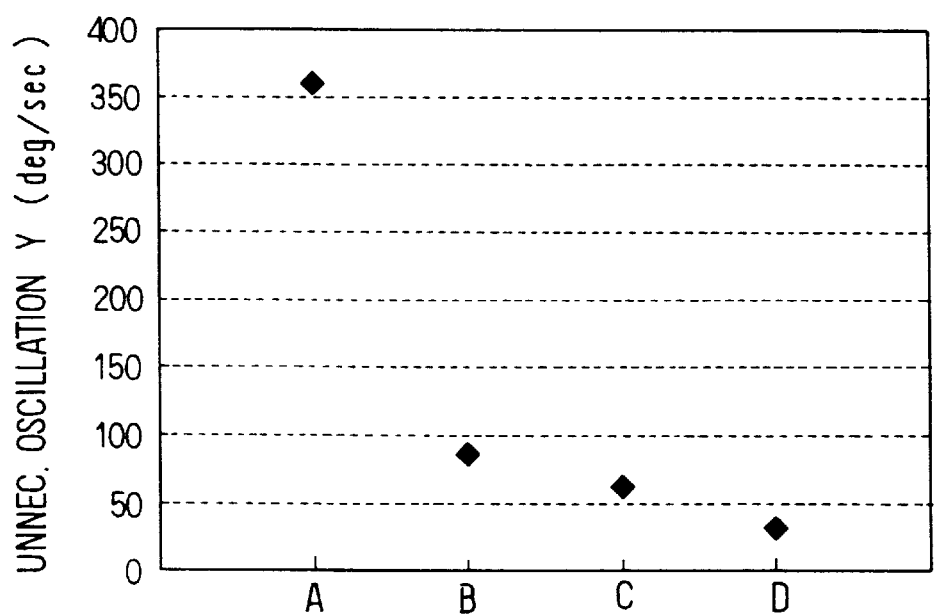
FIG. 6 is a graph showing unnecessary oscillations of samples A to D.

Other effects and features of the present invention are explained below referring to FIGS. 5A to 5D, 6, and 7. FIGS. 5A to 5D respectively show samples A to D used for calculating unnecessary oscillations and angular velocities. Sample A is a conventional beam portion, and sample B is a beam disclosed in "A Precision Yaw Rate Sensor in Silicon Micromachining", TRANSDUCERS' 97, pp. 847–850, 1997 IEEE. Samples C and D are beam portions according to the present invention. The beam portion of sample D has a bridge portion length longer than that of sample C. FIG. 6 shows unnecessary oscillations of samples A to D. FIG. 6 reveals that unnecessary oscillation can be largely reduced in samples B, C, and D as compared to that of sample A.

Figure 7:
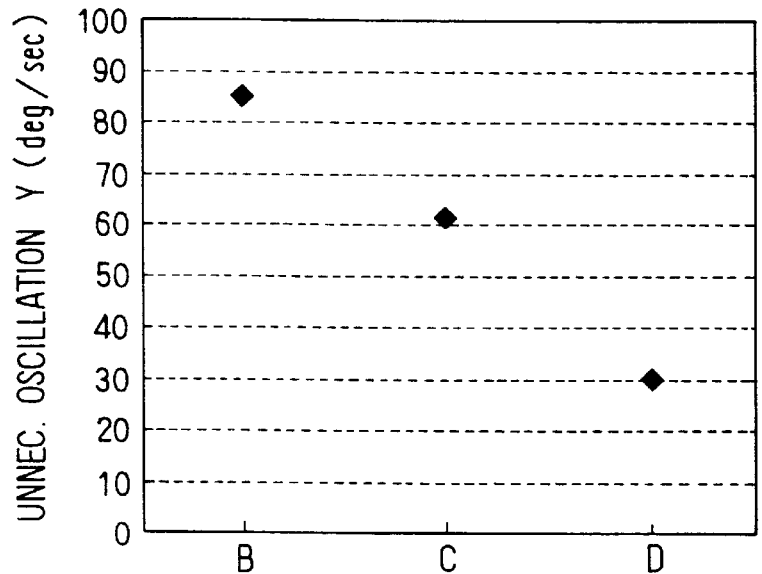
FIG. 7 is a graph showing unnecessary oscillations of samples B to D.

FIG. 7 shows unnecessary oscillations of samples B, C and D only to compare sample B, C, and D precisely. FIGS. 6 and 7 reveals that samples C and D are more effective to prevent unnecessary oscillation than sample B, and sample D having a longer bridge portion length than sample C is more effective to prevent unnecessary oscillation than sample C.

According to the present embodiment, in each beam portion 21, 31, the distance W1 between the connecting pole portions is larger than the distance W2 between the parallel pole portions. Accordingly, the bridge portion 24, 34 can be lengthened sufficiently. As a result, a difference in displacement between the parallel pole portions of the first beam and the parallel pole portions of the second beam can be easily absorbed not to prevent the oscillation of the oscillator.

Figure 8:
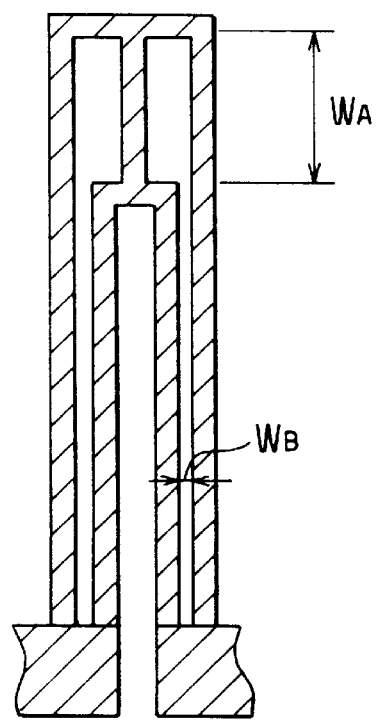
FIG. 8 is a schematic view showing a beam portion for explaining dimensions.
Figure 9:
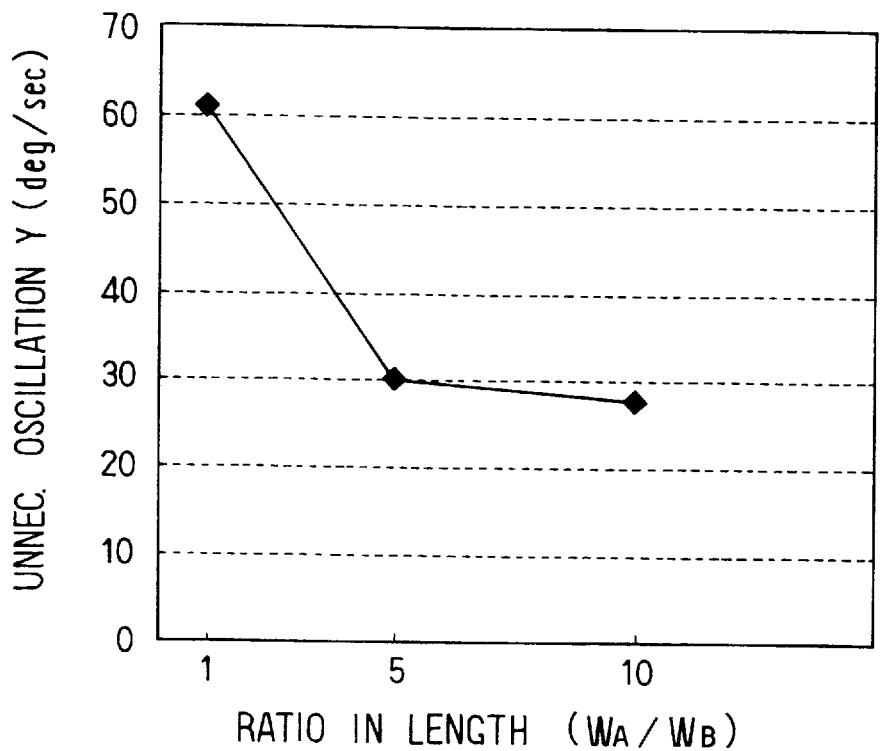
FIG. 9 is a graph showing unnecessary oscillations with respect to a ratio in length, $W_A/W_B$, of the beam portion shown in FIG. 8.

The effect due to the length of the bridge portion was further examined. Specifically, referring to FIG. 8, unnecessary oscillation was evaluated with respect to a ratio of length $W_A$ of the bridge portion relative to distance $W_B$ between the parallel pole portions, $W_A/W_B$. The results are shown in FIG. 9. According to the figure, when $W_A/W_B$ is approximately 5 or more, the effect for preventing unnecessary oscillation is significantly large as compared to case where $W_A/W_B$ is 1. The effect is almost saturated when $W_A/W_B$ exceeds 5. Therefore, the ratio in length, $W_A/W_B$, is sufficient to be approximately 5 or more.

On the other hand, if the bridge portion is too thick, the fixation between the pair of beams becomes too strong. The thick bridge portion may disturb the oscillation. If the bridge portion is too thin, it is difficult to be processed. Therefore, each of the bridge portions 24, 34 preferably has a width approximately equal to that of each of the beams 22, 23, 32, and 33.

Figure 10A:
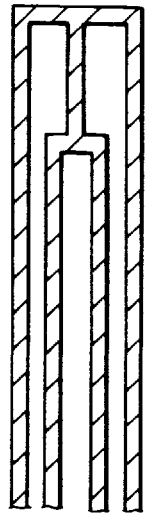
FIGS. 10A and 10B are schematic views showing samples E and F.
Figure 10B:
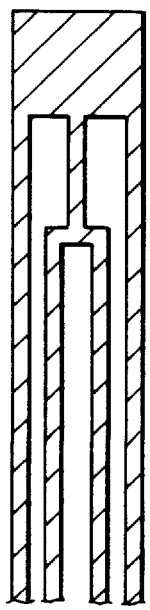
Figure 11:
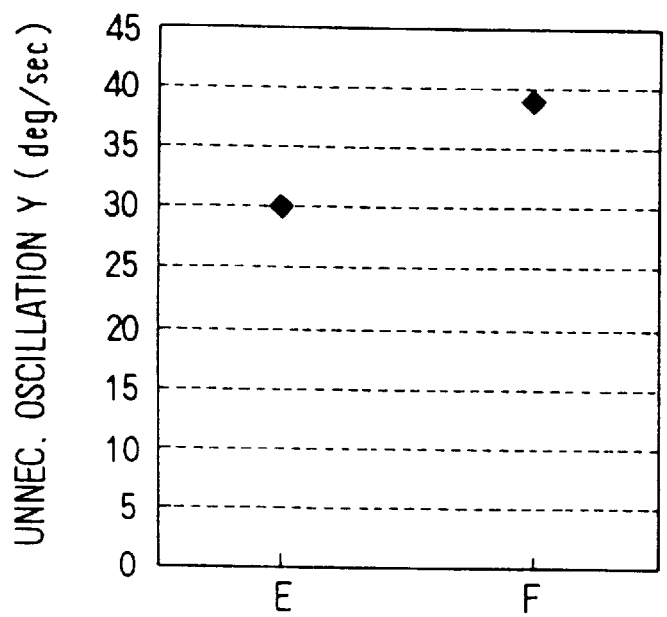
FIG. 11 is a graph showing unnecessary oscillations of samples E and F shown in FIGS. 10A and 10B.

Next, the effect due to the shape of the connecting pole portion is explained referring to FIGS. 10A, 10B and 11.

FIGS. 10A and 10B respectively show samples E and F, both of which adopt the structure according to the present invention. In sample E, the connecting pole portions connected by the bridge portion have substantially the same width as that of the bridge portion. In sample F, the outer one of the connecting pole portions has a width larger than that of the inner one. Unnecessary oscillations of samples E and F are shown in FIG. 11.

According to the figure, the outer connecting pole portion and the inner connecting pole portion should preferably have approximately the same width. That is, it is preferable that the bridge portion is connected to the outer and inner connecting pole portions having approximately the same width. Further, if one of the connecting pole portions has a thick portion, a mass of the beam portion is increased. The increase in mass can adversely affect unnecessary oscillation.

Incidentally, in each beam portion of the present invention, the bridge portion divides a gap (space), which is defined between the pair of beams, into two gaps each having a generally L shape. Since the bridge portion connects the two connecting pole portions generally at each center of the connecting pole portions, the two L-shaped gaps are symmetrically disposed with respect to the bridge portions. Accordingly, the difference in displacement between the first and second beams can be absorbed more effectively. The bridge portion preferably has a width that is constant from the first beam to the second beam.

Figure 12:
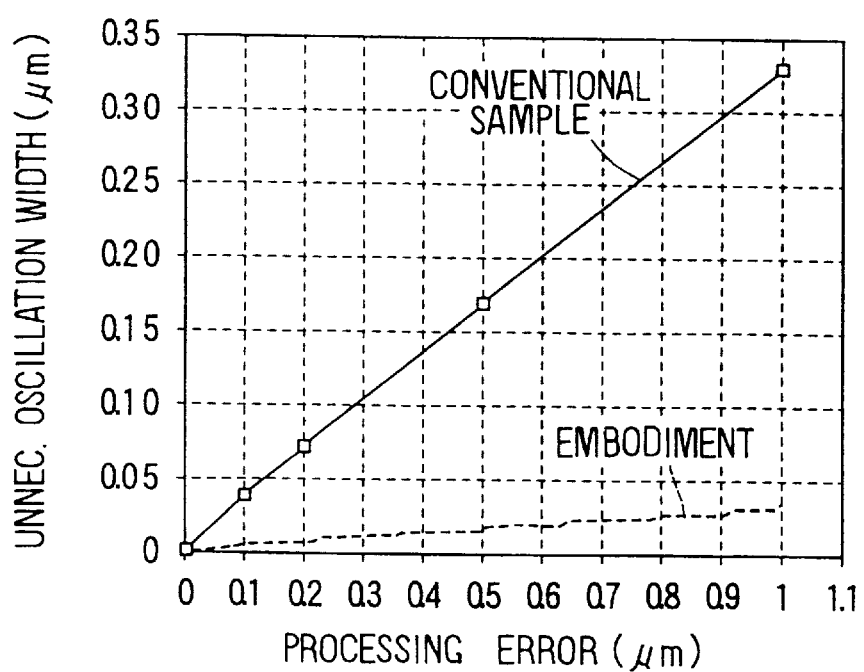
FIG. 12 is a graph showing unnecessary oscillations with respect to processing errors.

The effect of the present embodiment is further explained below referring to other experimental results shown in FIG. 12. In FIG. 12, unnecessary oscillation widths of the beams portions of the present angular velocity sensor 100 and a conventional angular velocity sensor are indicated with respect to processing errors. The present angular velocity sensor 100 adopts the beam portions each having the dimensions W1 to W3 explained above referring to FIG. 3. The conventional angular velocity sensor adopts beam portions each composed of one U-shaped beam J1 that is shown in FIG. 4 and has a width of 15 $\mu$m. As shown in FIG. 12, according to the present embodiment, unnecessary oscillation can be significantly decreased as compared to the conventional one (solid line) even in case where processing error is large.

While the present invention has been shown and described with reference to the foregoing preferred embodiments, it will be apparent to those skilled in the art that changes in form and detail may be made therein without departing from the scope of the invention as defined in the appended claims.

For instance, in the present embodiment, each of the drive beam portions 21 and the detection beam portions 31 is composed of a pair of beams disposed in parallel with and separated from each other. However, either of the beam portions 21 and the beam portions 31 may adopt the structure described above. That is, only the beam portions 21 may adopt the structure according to the present invention, or only the beam portions 31 may adopt the structure according to the present invention. The present invention can be applied to semiconductor physical quantity sensors such as an acceleration sensor in addition to the angular velocity sensor.

What is claimed is:

1. A semiconductor physical quantity sensor for detecting a physical quantity, the sensor comprising:
   a base portion;
   an oscillator that oscillates in a specific direction to detect a physical quantity applied thereto; and
   a beam portion connecting the base portion and the oscillator, the beam portion including:
      a first beam extending from the base portion to the oscillator and connecting the base portion to the oscillator;
      a second beam, which is spaced from the first beam, wherein the second beam extends from the base portion to the oscillator and connects the base portion to the oscillator, wherein the second beam is parallel to the first beam; and
      a bridge portion connecting the first beam to the second beam.

2. The semiconductor physical quantity sensor of claim 1, wherein;
   the first beam is generally U-shaped;
   the second beam is generally U-shaped and is located at an outer side of the first beam;
   each of the first beam and the second beam includes a pair of parallel pole portions, which are deformable in the specific direction in which the oscillator oscillates, and a connecting pole portion that connects the pair of parallel pole portions; and
   the bridge portion connects the connecting pole portion of the first beam and the connecting pole portion of the second beam.

3. The semiconductor physical quantity sensor of claim 2, wherein a first gap, which is formed between the connecting pole portion of the first beam and the connecting pole portion of the second beam, is larger than a second gap, which is formed between one of the pair of parallel pole portions of the first beam and a corresponding one of the pair of parallel pole portions of the second beam.

4. The semiconductor physical quantity sensor of claim 3, wherein the ratio of the first gap with respect to the second gap is larger than approximately 5.

5. The semiconductor physical quantity sensor of claim 1, wherein the width of the bridge portion is substantially equal to the width of each of the first and second beams.

6. A semiconductor physical quantity sensor for detecting a physical quantity, the sensor comprising:
   a base portion;
   an oscillator that oscillates in a specific direction to detect a physical quantity applied thereto; and
   a beam portion connecting the base portion and the oscillator, the beam portion including:
      a first beam extending from the base portion to the oscillator and connecting the base portion to the oscillator;
      a second beam, which is separated from the first beam by a space, wherein the second beam extends from the base portion to the oscillator and connects the base portion to the oscillator, wherein the second beam is parallel to the first beam; and
      a connecting pole connecting the first and second beams, wherein the connecting pole divides the space into first and second L-shaped gaps, which are symmetrical about the connecting pole.

7. The semiconductor physical quantity sensor of claim 6, wherein:
   each of the first and second beams has a first part, which extends in a direction approximately perpendicular to the specific direction, and a second part, which extends in the specific direction and is connected to the connecting pole, wherein the width of the second part of the first beam is approximately equal to the width of the second part of the second beam.

8. The semiconductor physical quantity sensor of claim 7, wherein the width of the connecting pole is constant from the second part of the first beam to the second part of the second beam.

9. The semiconductor physical quantity sensor of claim 6, wherein the width of the connecting pole is constant from the first beam to the second beam.

10. A semiconductor physical quantity sensor for detecting a physical quantity, the sensor comprising:
    a base portion;
    an oscillator that oscillates in a specific direction to detect a physical quantity applied thereto;
    a beam portion connecting the base portion and the oscillator, the beam portion including:
       a first beam extending from the base portion to the oscillator and connecting the base portion to the oscillator;
       a second beam, which is separated from the first beam by a space, wherein the second beam extends between the base portion and the oscillator and connects the base portion to the oscillator, and wherein the second beam is parallel to the first beam; and
       a bridge portion connecting the first and second beams, wherein the bridge portion divides the space into first and second gaps, and each gap includes a first gap part that extends in a direction approximately perpendicular to the specific direction, and wherein the length of the bridge portion is greater than the width of each first gap part.

11. The semiconductor physical quantity sensor of claim 10, wherein the first and second gaps are symmetrical with respect to the bridge portion.

12. The semiconductor physical quantity sensor of claim 10, wherein each of the first and second gaps is generally L-shaped.

13. The semiconductor physical quantity sensor of claim 12, wherein each of the first and second gaps has the first gap part and a second gap part communicating with the first gap part and extending perpendicularly to the first gap part, wherein the width of the second gap part is determined by the length of the bridge portion.

14. The semiconductor physical quantity sensor of claim 13, wherein the ratio of the width of the second gap part to the width of the first gap part is larger than approximately 5.

15. The semiconductor physical quantity sensor of claim 10, wherein each of the first and second beams has a generally right-angled corner.

16. The semiconductor physical quantity sensor of claim 10, wherein the width of the bridge portion is constant between the first and second beams.

17. The semiconductor physical quantity sensor of claim 16, wherein the width of the bridge portion is approximately equal to that of the first and second beams.

18. The semiconductor physical quantity sensor of claim 10, wherein the ratio of the length of the bridge portion to the width of the first gap part is larger than approximately 5.

19. A semiconductor physical quantity sensor for detecting a physical quantity, the sensor comprising:
- a base portion;
- an oscillator that oscillates in a specific direction to detect a physical quantity applied thereto;
- a beam portion for connecting the base portion and the oscillator, the beam portion including:
  - a first beam that extends from the oscillator to the base portion and connects the base portion to the oscillator;
  - a second beam, which is separated from the first beam by a space, wherein the second beam extends from the oscillator to the base portion and connects the base portion to the oscillator; and
  - a bridge portion connecting the first and second beams, wherein the bridge portion divides the space into first and second gaps, and the width of the bridge portion is approximately constant.

20. The semiconductor physical quantity sensor of claim 19, wherein each of the first and second gaps has a first gap part, which extends in a direction approximately perpendicular to the specific direction, and a second gap part, which communicates with the first gap part and extends in the specific direction.

21. The semiconductor physical quantity sensor of claim 19, wherein the width of the bridge portion is approximately equal to the width of one of the first and second beams.

22. The semiconductor physical quantity sensor of claim 19, wherein:
- the oscillator comprises a drive oscillator and a detection oscillator surrounding the drive oscillator;
- a second beam portion for connecting the detection oscillator and the drive oscillator, the second beam portion including:
  - a first beam that extends from the drive oscillator to the detection oscillator and connects the drive oscillator to the detection oscillator;
  - a second beam, which is separated from the first beam by a space, wherein the second beam extends from the drive oscillator to the detection oscillator and connects the drive oscillator to the detection oscillator; and
  - a bridge portion connecting the first and second beams, wherein the bridge portion divides the space into first and second gaps, and the width of the bridge portion is approximately constant.

* * * * *